(12) United States Patent
Chen et al.

(10) Patent No.: US 10,430,542 B2
(45) Date of Patent: Oct. 1, 2019

(54) SYSTEM, METHOD AND COMPUTER PROGRAM PRODUCT FOR INTEGRATED COMPUTATIONAL ELEMENT DESIGN OPTIMIZATION AND PERFORMANCE EVALUATION

(71) Applicant: Halliburton Energy Services, Inc., Houston, TX (US)

(72) Inventors: Dingding Chen, Tomball, TX (US); Christopher Michael Jones, Houston, TX (US); David L. Perkins, The Woodlands, TX (US); Li Gao, Katy, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 276 days.

(21) Appl. No.: 14/435,394

(22) PCT Filed: Nov. 9, 2012

(86) PCT No.: PCT/US2012/064346
§ 371 (c)(1),
(2) Date: Apr. 13, 2015

(87) PCT Pub. No.: WO2014/074108
PCT Pub. Date: May 15, 2014

(65) Prior Publication Data
US 2015/0234976 A1    Aug. 20, 2015

(51) Int. Cl.
*G06F 17/50*    (2006.01)
*G06N 3/12*    (2006.01)

(52) U.S. Cl.
CPC ......... *G06F 17/5081* (2013.01); *G06N 3/126* (2013.01)

(58) Field of Classification Search
CPC ..... G06F 17/5081; G06F 17/50; G06N 3/126; G01B 11/02; G06E 3/00; E21B 43/128; E21B 47/102; E21B 47/12; Y04S 10/54
See application file for complete search history.

(56) References Cited

U.S. PATENT DOCUMENTS

| | | | |
|---|---|---|---|
| 5,768,150 A | 6/1998 | Sonoda et al. | |
| 7,707,541 B2 | 4/2010 | Abrams et al. | |
| 2002/0090650 A1 | 7/2002 | Empedocles et al. | |
| 2003/0233304 A1* | 12/2003 | Dhurandhar | G06Q 40/06 705/36 R |
| 2004/0208350 A1 | 10/2004 | Rea et al. | |
| 2006/0095228 A1 | 5/2006 | Wilby | |

(Continued)

OTHER PUBLICATIONS

Haibach et al., "On-line reoptimization of filter designs for multivariate optical elements", pp. 1833-1838, Apr. 1, 2003, vol. 42, No. 10, Applied Optics. (Year: 2003).*

(Continued)

*Primary Examiner* — Vuthe Siek
(74) *Attorney, Agent, or Firm* — Haynes and Boone, LLP

(57) ABSTRACT

A system for integrated computational element ("ICE") design optimization and analysis utilizes a genetic algorithm to evolve layer thickness of each fixed ICE structure using a constrained multi-objective merit function. The system outputs a ranked representative group of ICE design candidates that may be used for further fabricability study, ICE combination selection, efficient statistical analysis and/or feature characterization.

30 Claims, 7 Drawing Sheets

(56) References Cited

U.S. PATENT DOCUMENTS

| | | | |
|---|---|---|---|
| 2007/0016381 A1 | 1/2007 | Kamath et al. | |
| 2007/0100580 A1 | 5/2007 | Marcus et al. | |
| 2008/0300934 A1* | 12/2008 | Srivastava | G06Q 10/0637 705/7.38 |
| 2010/0153048 A1 | 6/2010 | Myrick et al. | |
| 2010/0239822 A1* | 9/2010 | Pelizzo | B82Y 10/00 428/172 |
| 2011/0085232 A1* | 4/2011 | Werner | B82Y 20/00 359/350 |
| 2012/0010841 A1* | 1/2012 | Shakespeare | D21G 9/0009 702/104 |

OTHER PUBLICATIONS

Haibach et al, On-Line Reoptimization of Filter Designs for Multivariate Optical Elements, Applied Optics, vol. 42, No. 10, 2003, pp. 1833-1838.

International Preliminary Report on Patentability, dated Nov. 7, 2014, PCT/US2012/064346, 5 pages, IPEA/US.

International Search Report and the Written Opinion of the International Searching Authority, or the Declaration, dated Nov. 7, 2014, PCT/US2012/064346, 8 pages, ISA/US.

Myrick et al., A Single-Element All-Optical Approach to Chemometric Prediction, Elsevier Science, Vibrational Spectroscopy, vol. 28, 2002, pp. 73-81.

Simcock et al., Precision in Imaging Multivariate Optical Computing, Applied Optics, vol. 46, No. 7, 2007, pp. 1066-1080.

Soyemi et al., Nonlinear Optimization Algorithm for Multivariate Optical Element Design, Society for Applied Spectroscopy, vol. 56, No. 4, 2002, pp. 477-487.

* cited by examiner

US 10,430,542 B2

SYSTEM, METHOD AND COMPUTER PROGRAM PRODUCT FOR INTEGRATED COMPUTATIONAL ELEMENT DESIGN OPTIMIZATION AND PERFORMANCE EVALUATION

The present application is a U.S. National Stage patent application of International Patent Application No. PCT/US2012/064346, filed on Nov. 9, 2012, the benefit of which is claimed and the disclosure of which is incorporated herein by reference in its entirety.

FIELD OF THE INVENTION

The present invention relates generally to designing integrated computational elements ("ICE") and, more specifically, to a method for ICE design optimization and analysis which utilizes a genetic algorithm to evolve the thickness of ICE layers using a constrained multi-objective function.

BACKGROUND

ICE techniques are variations of multivariate optical elements ("MOE") which were originally targeted for qualitative and quantitative analysis of physical or chemical properties of interest in chemometrics. In recent years, ICE techniques have been developed for applications in the Oil and Gas Industry in the form of optical sensors on downhole or surface equipment to evaluate a variety of fluid properties. ICE structures typically consist of multiple physical layers with different refractive indexes in the film material, wherein their optical or spectroscopic characteristics, if designed properly, can be transformed into effective inputs for linear and nonlinear multivariate calibration.

ICE design optimization is crucial in providing appropriate candidates for performance and fabricability analysis and manufacturing. Conventional ICE design begins with a very large number of structure simulations such as, 100,000 or more, for example. In each original design, first the number of ICE layers and layer thickness are randomly initiated. Next, a gradient-based optimization routine is performed by calculating the first derivative or the second derivative (i.e., Gauss-Newton Method) to update the layer thickness. Then, layers are deleted or combined to implement the preliminary ICE structure. The candidate solutions, with significantly reduced numbers of designs, are then selected through a post-processing procedure that applies multiple thresholds, such as the maximum and minimum number of layers, minimum single film thickness, maximum total film thickness and minimum system percentage transmittance.

There are a number of disadvantages associated with conventional ICE design optimization approaches. First, conventional approaches begin with a voluminous number of preliminary designs in order to maximize the likelihood that the most feasible candidates are analyzed, which may take 10-12 hours, in general, to perform the simulations. Second, due to the volume of preliminary designs and the candidate finalization process, which involves spectrum visualization, parameter cross-plotting and tolerance-based fabrication analysis, existing approaches require an enormous amount of computing power. As a result, high intensity simulation and dramatic post processing are necessary which require design suite systems having 15-node computer clusters (master and nodes) or multiple processors that present extra hardware and software requirements. Third, conventional methodologies utilize a single-objective (standard error of calibration, for example) function to determine calibration coefficients for the ICE structures, which often conflicts with other important measures that may be crucial for fabricability of the designs.

In view of the foregoing, there is a need in the art for an efficient, cost-effective ICE design optimization technique which reduces computing requirements and computation cost.

DESCRIPTION OF ILLUSTRATIVE EMBODIMENTS

Illustrative embodiments and related methodologies of the present invention are described below as they might be employed in a method for ICE design optimization and analysis. In the interest of clarity, not all features of an actual implementation or methodology are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure. Further aspects and advantages of the various embodiments and related methodologies of the invention will become apparent from consideration of the following description and drawings.

Exemplary embodiments of the present invention are directed to optimization design techniques for integrated computational elements ("ICE"), also referred to as multivariate optical elements, which are utilized in optical computing devices. An optical computing device is a device configured to receive an input of electromagnetic radiation from a substance or sample of the substance and produce an output of electromagnetic radiation from a processing element. The processing element may be, for example, an ICE structure. Fundamentally, optical computing devices utilize optical elements to perform calculations, as opposed to the hardwired circuits of conventional electronic processors. When electromagnetic radiation interacts with a substance, unique physical and chemical information about the substance is encoded in the electromagnetic radiation that is reflected from, transmitted through, or radiated from the sample. This information is often referred to as the substance's spectral "fingerprint." Thus, the optical computing device, through use of the ICE structure, is capable of extracting the information of the spectral fingerprint of multiple characteristics or analytes within a substance and converting that information into a detectable output regarding the overall properties of a sample.

Figure 1:
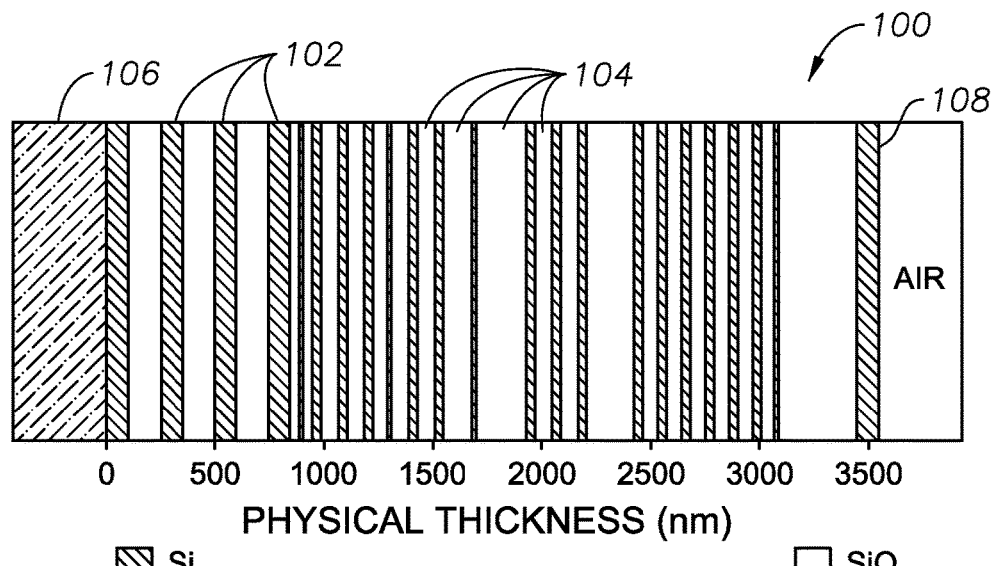
FIG. 1 illustrates an exemplary ICE structure which may be fabricated in accordance to embodiments of the present invention.

Referring to FIG. 1, illustrated is an exemplary ICE structure 100 which may be fabricated through utilization of the exemplary design optimization processes described herein. ICE structure 100 may include a plurality of alternating layers 102 and 104, such as, for example, silicon (Si) and quartz ($SiO_2$), respectively. Other non-limiting examples of layer material include niobium, germanium and Germania, MgF, SiO, and other high and low index materials, although persons of ordinary skill in the art having the benefit of this disclosure will understand that these layers consist of materials whose index of refraction is high and low, respectively. The layers 102, 104 may be strategically deposited on an optical substrate 106. In some embodiments, the optical substrate 106 is BK-7 optical glass. In other embodiments, the optical substrate 106 may be other types of optical substrates, such as quartz, sapphire, silicon, germanium, zinc selenide, zinc sulfide, or various plastics such as polycarbonate, polymethalmethacrylate PMMA), polyvinylchloride (PVC), diamond, ceramics, etc., as known in the art. At the opposite end (e.g., opposite the optical substrate 106), the ICE structure 100 may include a layer 108 that is generally exposed to the environmental air surrounding the device or installation. The number of layers 102, 104 and the thickness of each layer 102, 104 may be determined from the spectral attributes acquired from a spectroscopic analysis of a characteristic of the sample substance using a conventional spectroscopic instrument.

The spectrum of interest of a given characteristic of a sample typically includes any number of different wavelengths. It should be understood that the exemplary ICE structure 100 in FIG. 1 does not in fact represent any particular characteristic of a given sample, but is provided for purposes of illustration only. Consequently, the number of layers 102, 104 and their relative thicknesses, as shown in FIG. 1, bear no correlation to any particular characteristic of a given sample. Nor are the layers 102, 104 and their relative thicknesses necessarily drawn to scale, and therefore should not be considered to limit the present disclosure. Moreover, those skilled in the art will readily recognize that the materials that make up each layer 102, 104 may vary, depending on the application, cost of materials, and/or applicability of the material to the sample substance. For example, the layers 102, 104 may be made of, but are not limited to, silicon, quartz, germanium, water, combinations thereof, or other materials of interest. Furthermore, those same skilled persons will realize that the physical thicknesses of the layers 102 are exemplary in nature and, thus, may be altered as desired.

The multiple layers 102, 104 exhibit different refractive indices. By properly selecting the materials of the layers 102, 104 and their relative thicknesses and spacing, the exemplary ICE structure 100 may be configured to selectively pass/reflect/refract predetermined fractions of light (i.e., electromagnetic radiation) at different wavelengths. Through the use of regression techniques, the corresponding output light intensity of the ICE structure 100 conveys information regarding a characteristic of the analyte of interest. Further details regarding how the exemplary ICE structure 100 is able to distinguish and process electromagnetic radiation related to the characteristic of the analyte of interest are described in U.S. Pat. Nos. 6,198,531; 6,529,276; and 7,920,258, each of which are hereby incorporated by reference in their entirety. Accordingly, selection of layer thickness and spacing are critically important to the ICE design process.

Figure 2:
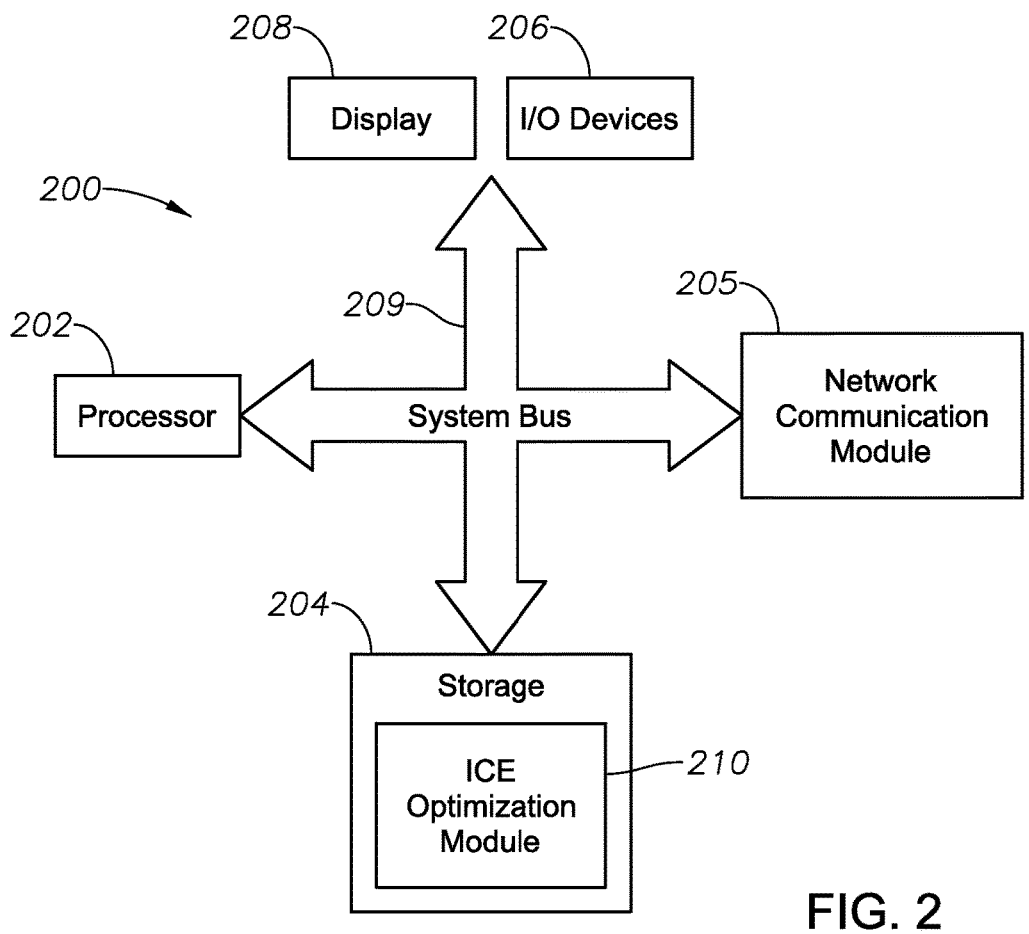
FIG. 2 illustrates a block diagram of an ICE optimization system in accordance to an exemplary embodiment of the present invention.

In view of the foregoing, FIG. 2 shows a block diagram of an ICE design optimization system according to an exemplary embodiment of the present invention. As will be described herein, ICE optimization system 200 provides a platform for ICE design optimization and analysis to facilitate rapid and efficient design and performance evaluation. Exemplary embodiments of ICE optimization system 200 described herein utilize a genetic algorithm as a search engine to evolve layer thicknesses of each ICE structure sequentially using a constrained multi-objective merit function. In each generation of the exemplary methodologies described herein, ICE optimization system 200 outputs a ranked layer thickness population that represents a group of ICE structures. The representative group can then be used directly for further fabricability study and/or ICE combination selection. In addition, the present invention provides well-organized and balanced ICE designs that enable efficient statistical analysis and feature characterization.

Referring to FIG. 2, ICE optimization system 200 includes at least one processor 202, a non-transitory, computer-readable storage 204, transceiver/network communication module 205, optional I/O devices 206, and an optional display 208 (e.g., user interface), all interconnected via a system bus 209. In one embodiment, the network communication module 205 is a network interface card (NIC) and communicates using the Ethernet protocol. In other embodiment, the network communication module 105 may be another type of communication interface such as a fiber optic interface and may communicate using a number of different communication protocols. Software instructions executable by the processor 202 for implementing software instructions stored within ICE design optimization module 210 in accordance with the exemplary embodiments described herein, may be stored in storage 204 or some other computer-readable medium.

Although not explicitly shown in FIG. 2, it will be recognized that ICE optimization system 200 may be connected to one or more public (e.g., the Internet) and/or private networks via one or more appropriate network connections. It will also be recognized that the software instructions comprising ICE design optimization module 210 may also be loaded into storage 204 from a CD-ROM or other appropriate storage media via wired or wireless methods.

Moreover, those skilled in the art will appreciate that the invention may be practiced with a variety of computer-system configurations, including hand-held devices, multi-processor systems, microprocessor-based or programmable-consumer electronics, minicomputers, mainframe computers, and the like. Any number of computer-systems and computer networks are acceptable for use with the present invention. The invention may be practiced in distributed-computing environments where tasks are performed by remote-processing devices that are linked through a communications network. In a distributed-computing environment, program modules may be located in both local and remote computer-storage media including memory storage devices. The present invention may therefore, be implemented in connection with various hardware, software or a combination thereof in a computer system or other processing system.

Figure 3:
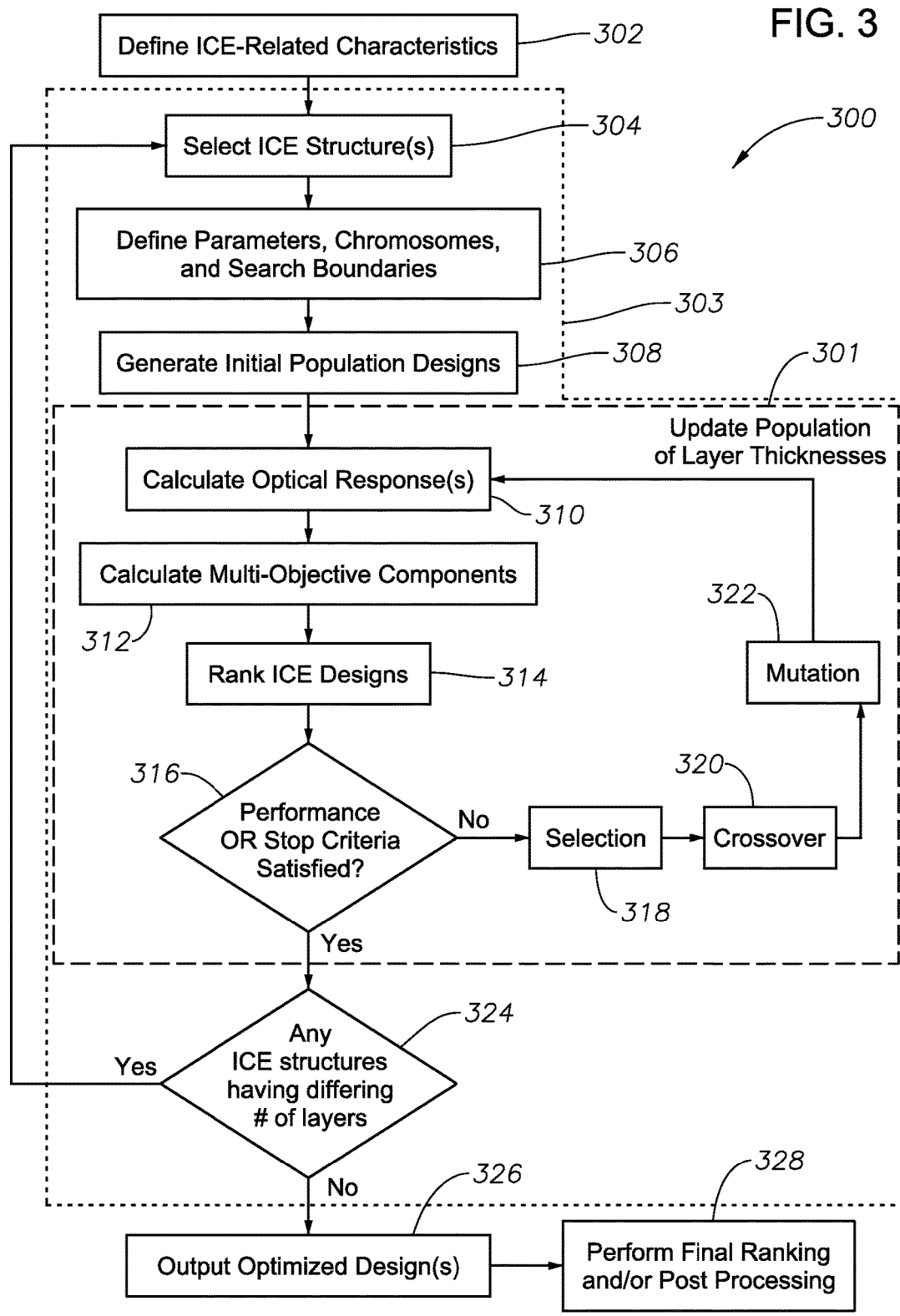
FIG. 3 is a flow chart detailing steps in an optimization process in accordance to an exemplary methodology of the present invention.

Referring to FIG. 3, an exemplary methodology of the present invention will now be described. As previously stated, exemplary embodiments of ICE design and optimization methodology 300 utilize a genetic algorithm to evolve ICE layer thicknesses through use of a constrained multi-objective function. As will be understood by those ordinarily skilled in the art having the benefit of this disclosure, a genetic algorithm is a stochastic global search engine that mimics the metaphor of natural biologic evolution. As a computational intelligent method, genetic algorithms operate on a population of potential solutions applying the principle of survival of the fittest to produce improved solutions through multiple generations. At each generation, the fitness of each individual is evaluated based on the user-defined objective function, and an updated population of solutions are created by using genetic operators such as ranking, selection, crossover and mutation. As utilized in exemplary embodiments of the present invention, this evolutionary computation approach eliminates the need to calculate the first derivative and/or the second derivative (as done in conventional optimization methods) and is suitable to solve complex problems such as those presented in ICE design optimization.

At step 302, one or more characteristics of a proposed ICE structure are defined. In this exemplary embodiment, ICE optimization system 200 detects entry of ICE related characteristics via a user interface comprising display 208 and one or more I/O devices 206. Software instructions necessary to implement and display a graphical user interface are executed by processor 202 as would be understood by those ordinarily skilled in the art having the benefit of this disclosure. In this exemplary embodiment, the ICE related characteristics that may be entered include, for example, number of candidate layers, materials, optical system components, calibration sample spectra or target analyte property. In one embodiment, the number of candidate layers for a specific ICE structure is inputted as a range of, for example, 6-15 layers. In another embodiment, the number of candidate layers may be inputted as a fixed number of layers. Nevertheless, all ICE related characteristics except for layer thicknesses are pre-defined by the user and inputted at step 302. In an alternative embodiment, however, the ICE related characteristics may be retrieved locally from the memory of ICE optimization system 200 or from a remote location or database, as would be understood by those ordinarily skilled in the art having the benefit of this disclosure.

At step 304, an ICE structure is selected as defined by the entered characteristic(s). Here, in this exemplary embodiment, ICE optimization system 200 selects a first ICE structure as defined in step 302 to begin an algorithm whereby one or more ICE designs are optimized. For example, if a layered characteristic of 6-15 layers was entered at step 302, the first selected ICE structure may have 6 layers. As described herein, application of the genetic algorithm requires definition of ICE design parameters to be optimized through evolutionary computation, the searching boundary for each parameter and the representative chromosomes (coded in binary string, for example). In addition, some genetic algorithmic operational parameters also need to be specified for control of computational efficiency and design diversity. Thus, as will be described in more detail below, ICE optimization system 200 utilizes a genetic algorithm to optimize the thicknesses of the ICE layers, thereby calculating one or more optimized ICE designs. Thereafter, ICE optimization system 200 outputs the one or more optimized ICE designs.

To achieve the foregoing objectives, at step 306, ICE optimization system 200 defines one or more of these parameters. Given the ICE structure, the typical design parameter is the film thickness in each layer, and the typical genetic algorithmic operational parameters are population size (i.e., number of potential solution designs) and the total number of generations (i.e., loop iterations). The other genetic algorithmic operational parameters are genetic operator-related (crossover and mutation, for example), which have less significant impact on the results of optimized designs.

In certain exemplary embodiments, the searching boundaries for each design parameter may be pre-defined by ICE optimization system 200. Thus, as step 306, ICE optimization system 200 pre-sets the searching boundaries to a population size of 500 and the maximum number of ICE generations to 20. A "generation," as described herein, refers to a single pass around genetic algorithmic loop 301. In another embodiment, the layer thickness boundary can be set to different values for different layers. In this case, an ICE structure with a smaller number of layers may allow the use of thicker layers, while an ICE structure with a larger numbers of layers may require limiting of the upper searching boundary to a more practical value. Moreover, in an alternative embodiment, the searching boundaries may be defined by a user.

Still referring to step 306, ICE optimization system also defines a representative chromosome to the individual layers. Given the pre-defined number of layers in a specific ICE, ICE optimization system 200 analyzes the film thickness in each layer as an individual design parameter. Thus, in this exemplary embodiment, a 6-layer structure will have 6 design parameters and a 15-layer structure will have 15 design parameters. Each design parameter is represented by a binary string, called a representative chromosome, in applying genetic operators. Thus, in an exemplary embodiment of step 306, ICE optimization system 200 may encode the film thickness for each layer using a 12 to 16-bit binary string. Assuming that a 12-bit string is used, the total length of chromosome will be 72 bits for a 6-layer ICE and 180 bits for a 15-layer ICE. The dynamic thickness range may be from 50 to 1200 nanometers for each layer. However, those ordinarily skilled in the art having the benefit of this disclosure realize that other encoding techniques may be utilized such as, for example, non-standard Gray code and real-value based genetic algorithmic applications.

At step 308, for a given initial ICE population, ICE optimization system 200 randomly assigns a layer thickness for each layer and, thereafter, updates the layer thicknesses through multiple generations to improve the performance of the ICE structures, as will be described below. At step 310, ICE optimization system 200 calculates the optical response for each ICE design. As understood by those ordinarily skilled in the art having the benefit of this disclosure, once the ICE structure, layer thickness, material and system optical characteristic information (for example, lamp spectral profile, detector spectral sensitivity, etc.) have been specified, ICE optimization system 200 calculates the transmittance spectrum (i.e., optical response) using, for example, Fresnel's equations, as would be understood by those ordinarily skilled in the art having the benefit of this disclosure.

Thereafter, at step 312, certain exemplary embodiments of ICE optimization system 200 utilize a multi-objective merit function to evaluate the fitness of the ICE candidate designs. In one embodiment, the multi-objective merit function is constructed by aggregating at least two of three objective components into a single figure of merit to determine the optimal trade-off of ICE designs. In this embodiment, the three objective components are standard error of calibration ("SEC"), detector output sensitivity ("DOS"), and percentage of ICE or sensor transmittance ("PST"). SEC is the root of mean-squared error of the ICE prediction compared to the target as expressed in the following equation:

$$SEC = \sqrt{mse(\hat{Y}_{cal} - Y_{cal})}, \quad \text{Eq. (1)}$$

where $\hat{Y}$ and $Y$ is an n by 1 vector respectively with n being the number of calibration samples. DOS is the absolute value of the slope a as defined by the following equations:

$$S = X \times (\text{mean}(T_s, 1)/100)^T \cdot /\text{sum}(X, 2), \quad \text{Eq. (2)}$$

$$Z = S \cdot /\text{mean}(S, 1), \quad \text{Eq. (3)}$$

$$[Z_{cal}; Z_{val}] = a \times [Y_{cal}; Y_{val}] + b, \quad \text{Eq. (4)}$$

$$DOS = 100 \times \text{abs}(a), \quad \text{Eq. (5)}$$

i.e., which is the detector signal change per unit of target concentration change fitted with all calibration and validation samples.

The intermediate variable S is an n by 1 ICE transmittance vector calculated with Eq. (2), where X and $T_s$ is an n by p matrix of the analyte transmittance spectra and ICE transmittance spectra, respectively, with p being the number of discrepant wavelengths. The function mean($T_s$,1) is averaged over the number of samples n, and the function mean (X,2) is averaged over the number of discrepant wavelengths p. The operator "·/" is to perform division element-by-element.

PST may be calculated using the following equation:

$$PST = \text{mean}([S_{cal}; S_{val}]) \times 100, \quad \text{Eq. (6)}$$

which is the percentage of ICE transmittance averaged over all calibration and validation samples. In this exemplary embodiment, $S_{cal}$ and $S_{val}$ are the calibration vector and validation vector, respectively, of S calculated in Eq. (2).

The multi-objective performance measure utilized in this embodiment of the present invention is a weighted function expressed as:

$$Perf = C_1 \frac{SEC}{\text{Max}(SEC)} - C_2 \frac{DOS}{\text{Max}(DOS)} - C_3 \frac{PST}{\text{Max}(PST)} \quad \text{Eq. (7)}$$

In Eq. (7), weighting coefficients C1, C2 and C3 are summed to 1 counting for the contributions to each objective component. Max (SEC), Max (DOS) and Max (PST) can be pseudo values and set as constants, and adjusted to within a predetermined range of its target objective (such as, for example, about three or four folds of its target objective, respectively) through experiments during the early phase of simulation. The performance function in ratio parameters may also ensure similar scale for each component. Since a small SEC and a large DOS and PST are desirable in optimization, ICE optimization system 200 utilizes the minus sign in Eq. (7) to convert the objective of partial maximization to a combined minimization problem. As would be understood by those ordinarily skilled in the art having the benefit of this disclosure, other exemplary objective functions include, but are not limited to, standard error of prediction (SEP), percentage of ICE reflectance (POR), the number of layers (NOL), and signal-to-noise ratio (SNR).

In an alternative exemplary embodiment, at step 312, ICE optimization system 200 may also utilize the multi-objective function with the use of constraints to remove unrealistic designs from the optimization loop. In this embodiment, the first threshold used by ICE optimization system 200 before calculating objective components is the total film thickness. To achieve the desired filtering, ICE optimization system 200 may set the output of the combined performance function to a very large positive value when the total film thickness, the sum of the individual layer thicknesses, is larger than a predetermined value, such as, 7 microns, for example. As second thresholds, ICE optimization system 200 may consider a particular design as less optimal if the calculated DOS and PST fall below user defined thresholds. Once such a design with these thresholds is identified, ICE optimization system 200 sets a large positive value to its objective measure, and the design will be removed after ranking which favors a minimized value of the objective function.

Nevertheless, at step 314, ICE optimization system 200 will rank the ICE designs. Here, in certain exemplary embodiments, given a certain population of designs, ICE optimization system 200 may only select a group of candidates (for example, the top 80%) and discard the rest, based upon their merit-function performance, to apply genetic operators for updating the design population in the next generation. At step 316, ICE optimization system 200 determines whether the performance requirements for the ICE design or the stop criteria have been met. The performance criteria may be set utilizing a variety of methods such as, for example, a user-defined minimum multi-objective merit function value threshold. The stop criteria, as previously described, may be set to a predetermined limit such as, for example, 20 generations. However, any number of generations may be selected as desired. If the determination is "no" with regards to either inquiry at step 316, ICE optimization system 200 then applies the genetic operators (i.e., selection (step 318), crossover (step 320) and mutation (step 322)) to ranked ICE designs, as will be readily understood by those ordinarily skilled in the art having the benefit of this disclosure.

Thereafter, the algorithm loops back to step 310 (i.e., algorithmic loop 301), where ICE optimization system may add a number of elite designs randomly generated from a second or sub-population with the same fixed structure as the first population, and again calculates the optical response of each. As such, algorithmic loop 301 continues to optimize the ICE designs until ICE optimization system 200 determines either (1) that the performance criteria have been met or (2) that the defined number of generations has been performed (i.e., stop criteria) at step 316. Once ICE optimization system 200 determines that the ICE performance or stop criteria have been satisfied at step 316, the algorithm utilized in methodology 300 moves on to step 324.

At step 324, ICE optimization system 200 determines whether there are other ICE structures yet to be analyzed which have a different number of layers. As described above, one exemplary embodiment of the present invention allows entry of a range of candidate layers for an ICE structure at step 302. In such embodiments, at step 324, ICE optimization system 200 will continue to determine a "yes" until the full range of defined ICE layers (6-15 layers, for example) have been analyzed via algorithmic loop 303. For example, after a population of designs correlating to a 6 layer ICE structure have been determined, a population of 7 layer designs would then be analyzed at step 304. This loop would then be continued until a population of 15 layer ICE designs was optimized. Therefore, in this exemplary embodiment, algorithmic loop 303 is applied to all candidate ICE structures (from 6-15 layers, for example), while algorithmic loop 301 is applied to a particular ICE structure with a fixed number of layers. Those of ordinary skill in the art will appreciate that while the progress of the iterative process has been described as beginning with the lowest numbered layer and progressing to the largest numbered layer, analysis can begin with any layer number so long as the looping process accounts for all layers within the group.

Still referring to step 324, once ICE optimization system 200 determines that the full range of ICE structures have been analyzed and there are no further ICE structures remaining to be analyzed, at step 326, ICE optimization system 200 will then calculate and output one or more optimized designs which include the full layered range of the defined ICE structures. Thereafter, at step 328, ICE optimization system 200 performs a final ranking of the ICE structures based upon merit function performance and post-processing to further determine which of the output design is more favorable to fabrication with respect to manufacturing errors and environmental deployment considerations (i.e. temperature, pressure, humidity).

Accordingly, through utilization of the present invention, high diversity in candidate designs can be cost-effectively controlled and achieved by a) deploying diverse ICE structures with different layers; b) setting multiple weighting factors during multi-objective evolutionary computation for each ICE structure; c) selecting suitable genetic algorithmic operational parameters to make optimization less convergent; d) adding elite designs from the second randomly generated population to the first (primary) population in each generation; and e) outputting more ranked ICE designs.

As described in certain exemplary embodiments herein, for each ICE structure, a population size may be set as a default, such as for example, 500 (step 306), and evolved through multiple generations, such as for example, 20 (step 316), with different combinations of weighting factors, such as for example, 5. In embodiments where, for example, the ICE candidate structures are modeled with 6 to 15-layer structures, only the top 100 unique designs might be stored from a 500-member population for each combination of weighting factors. Therefore, in this example, ICE optimization system 200 would output 10×5×100=5000 diverse ICE designs. Storing the top 200 designs for each case or weighting factor combination will generate 10,000 designs with no additional computational cost.

Figure 4A:
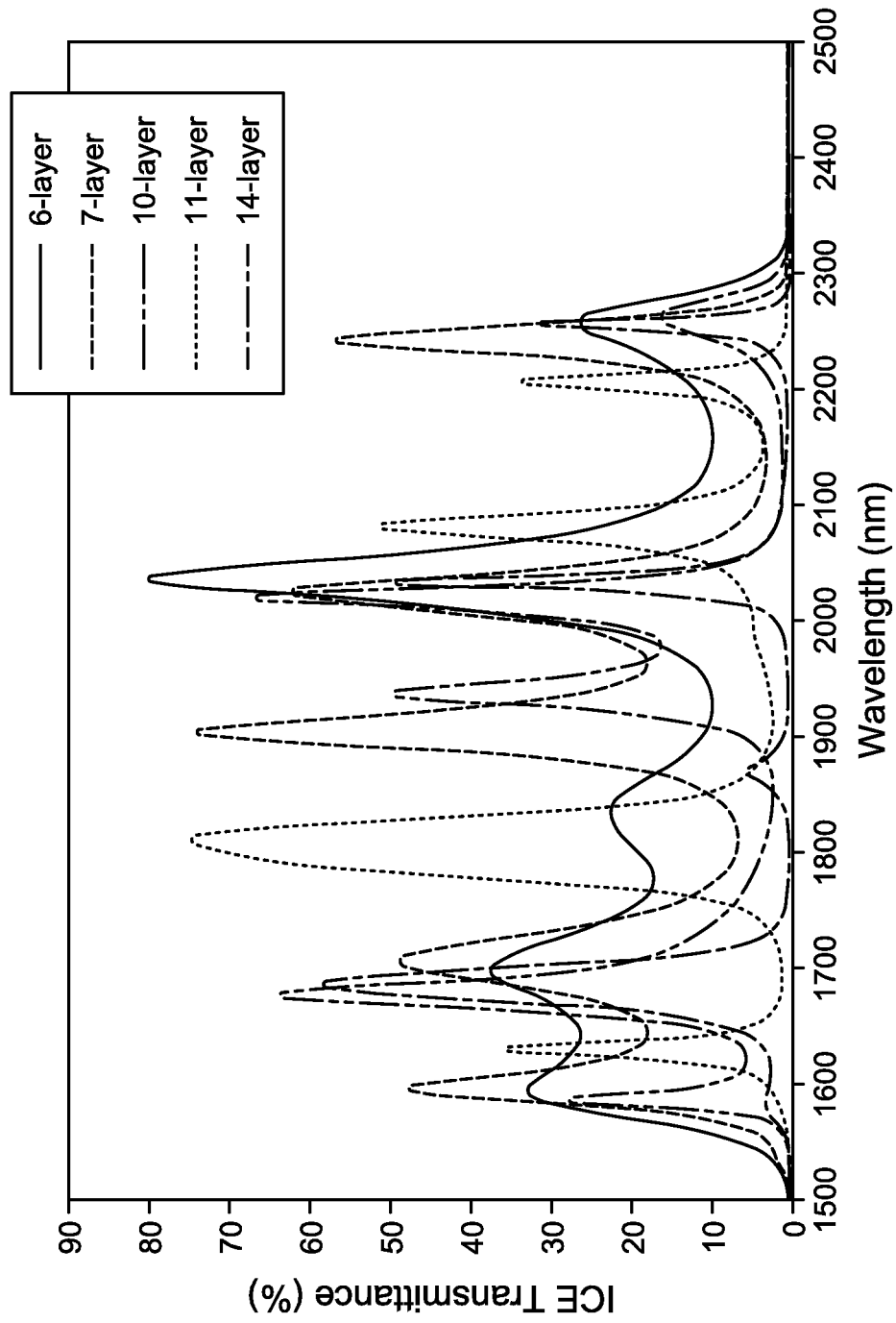
FIG. 4A is a graphical illustration of ICE transmittance spectra simulated with five different ICE structures in accordance to an exemplary embodiment of the present invention.
Figure 4B:
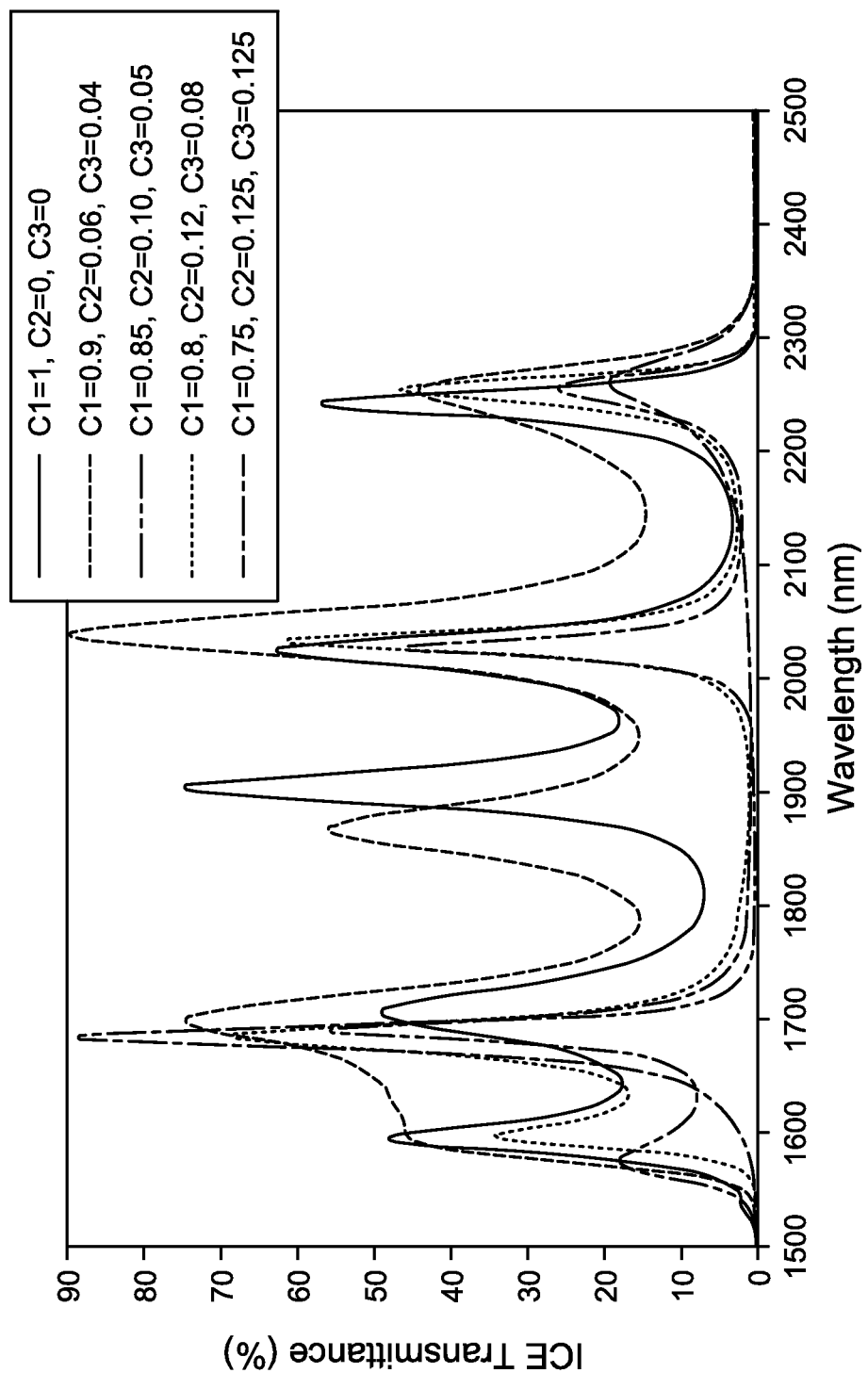
FIG. 4B is a graphical illustration of ICE transmittance spectra simulated with five different combinations of weighting factors on a seven layer ICE structure in accordance to an exemplary embodiment of the present invention.
Figure 4C:
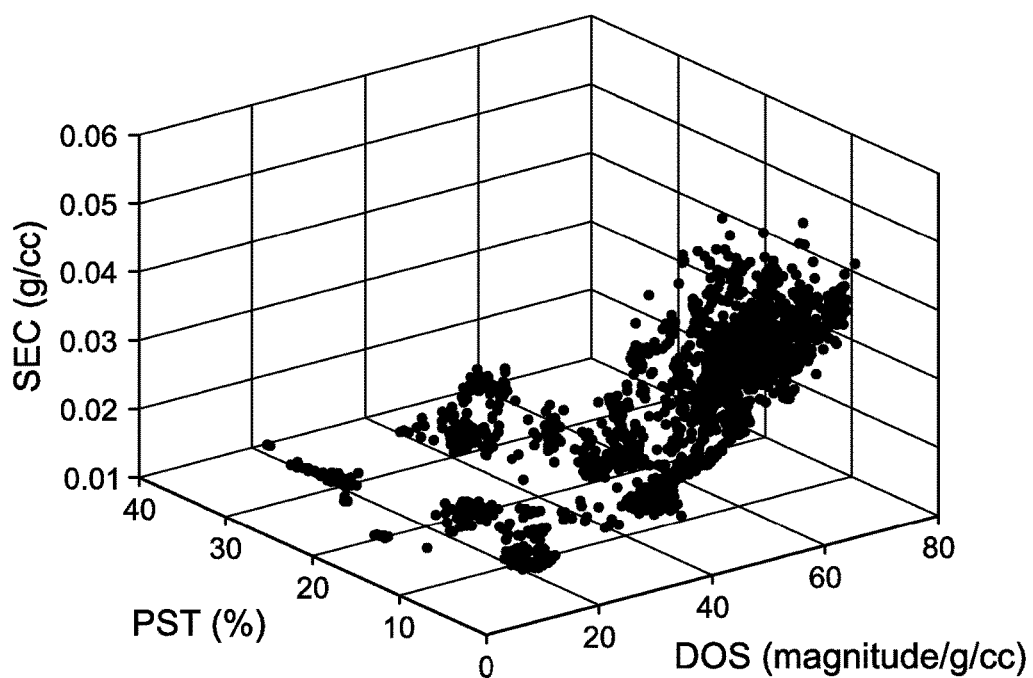
FIG. 4C is a graphical illustration of a three-dimensional plot of multi-objective components of the overall ICE designs utilized to determine fabrication candidates in accordance to an exemplary embodiment of the present invention.

FIGS. 4A-4C illustrate a variety of exemplary ICE structural characteristics achievable through use of the present invention. In this regard, FIG. 4A is an exemplary graph showing five ICE transmittance spectra simulated with different ICE structures. Each ICE transmittance spectrum can be interpreted as a multi-band filter. When the ICE transmittance spectrum interacts with the analyte spectrum, often functioning as the dot or inner product, the resulting signal responses will be dominantly contributed by the summation of the product of each band-pass or peak portion of ICE transmittance and the corresponding portion of analyte spectrum at the same wavelength. The magnitude variations of peaks represent the strength or intensity of the transmittance and the impact of the significance on the detector signal response. The flat response in the ICE transmittance spectrum typically indicates a band-prohibited portion if the percentage of transmittance is close to zero. The non-zero flat zone in the spectrum has an insignificant effect on the detector signal response. The diverse profiles shown in FIG. 4A indicate the among-structure effect on the transmittance spectra that might lead to corresponding variations of the detector signal response when interacted with an analyte spectrum of interest, thus forming different inputs for calibration analysis.

FIG. 4B is an exemplary plot showing five ICE transmittance spectra simulated with different weighting coefficients for a multi-objective function on a 7-layer structure. Here, it can be observed that the within-structure effect for the selected spectra in FIG. 4B is less significant across the distinct bands; however, the discrepancies in transmittance could be still adequate enough to quantify the detector response.

FIG. 4C is an exemplary 3-dimensional plot showing three objective components of 4500 ICE designs that satisfies all basic design constraints. As would be understood by those ordinarily skilled in the art having the benefit of this disclosure, those ICE candidates having a smaller SEC and larger PST and DOS values will be the most promising fabrication candidates. Accordingly, the candidates for further fabricability study can be determined by visualizing the plots of FIGS. 4A-4C and locating the designs with the best balance with respect to multiple performance measures, which may form part of the post processing step 328.

Figure 5A:
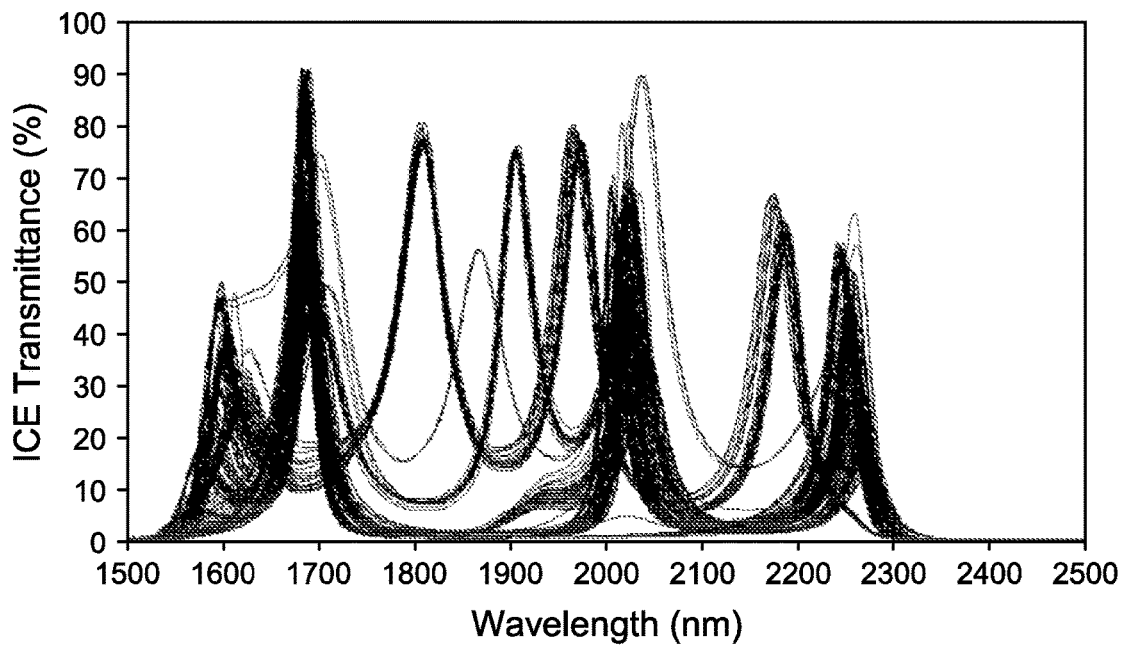
FIG. 5A is a graphical illustration of overall ICE spectra of an empirical design with seven physical layers driven by five multi-objective function in accordance to an exemplary embodiment of the present invention.
Figure 5B:
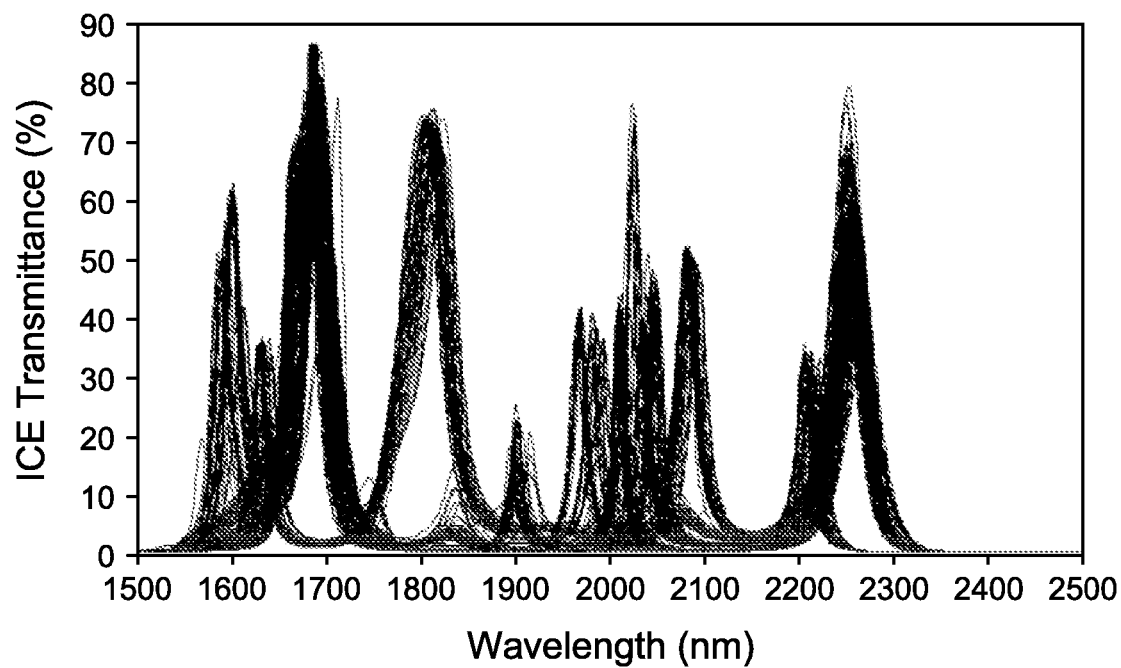
FIG. 5B is a graphical illustration of overall ICE spectra of an empirical design with eleven physical layers driven by five multi-objective functions in accordance to an exemplary embodiment of the present invention.

In yet another exemplary embodiment of the present invention, ICE optimization system 200 may also characterize features of the ICE designs. Because the genetic algorithmically optimized ICE structures are organized according to layer number and weighting factors of a multi-objective function, spectral features can be visualized by category to distinguish the differences and recognize the profiles of interest. To illustrate this, FIGS. 5A and 5B show 500 ICE spectra of candidate designs with a 7-layer structure and 11-layer structure, respectively, which are driven by multi-objective functions based upon 5 different weighting factor combinations. Typically, the transmittance spectra of ICE structures with fewer physical layers are characterized with a wider FWHM (Full Width at Half Maximum of the Peak) when compared to ICE structures having more physical layers. Although a wider FWHM spectra often indicates a higher PST, SEC and DOS may be sacrificed at the same time. Clustering analysis can further assist in distinguishing ICE designs based on their spectral characteristic vicinity or proximity.

Figure 5C:
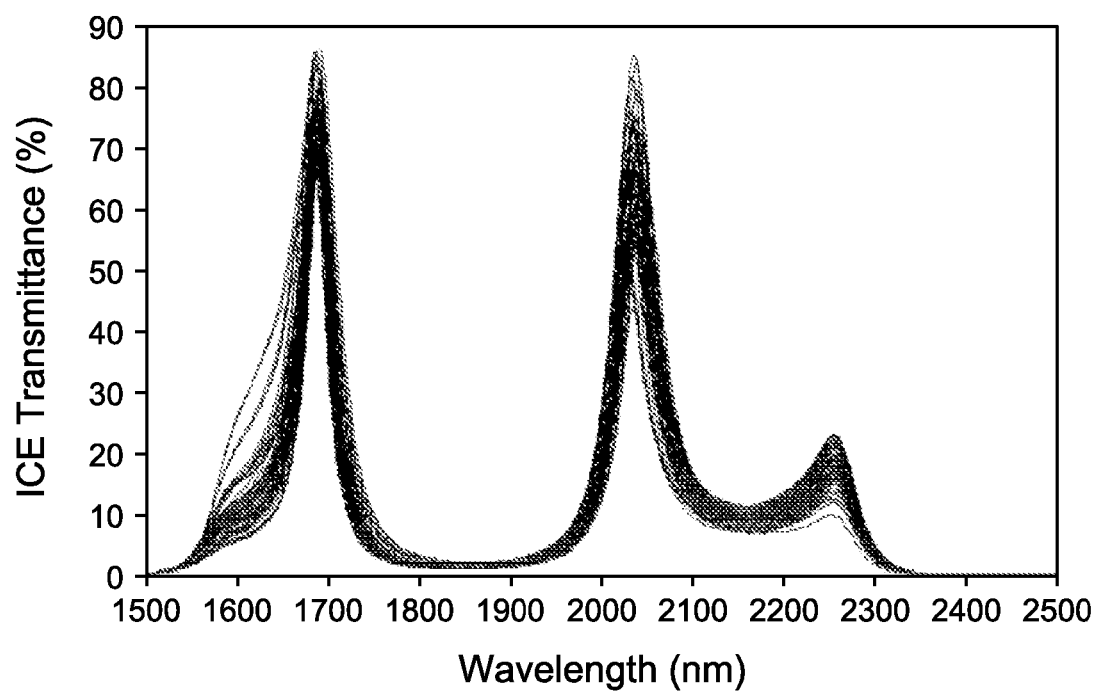
FIG. 5C is a graphical illustration of an ICE cluster having similar features among the ICE candidate designs using the same structure and objective function in accordance to an exemplary embodiment of the present invention.

In FIG. 5C, a single weighting factor combination is well-fitted into a cluster when applied to the top 100 designs (more convergent part of the plots) generated using a 6-layer structure. These designs have similar profiles or curvatures in spectra, and their differences reflect the sensitivity of the transmittance to the minor change of the layered film thicknesses.

Figure 5D:
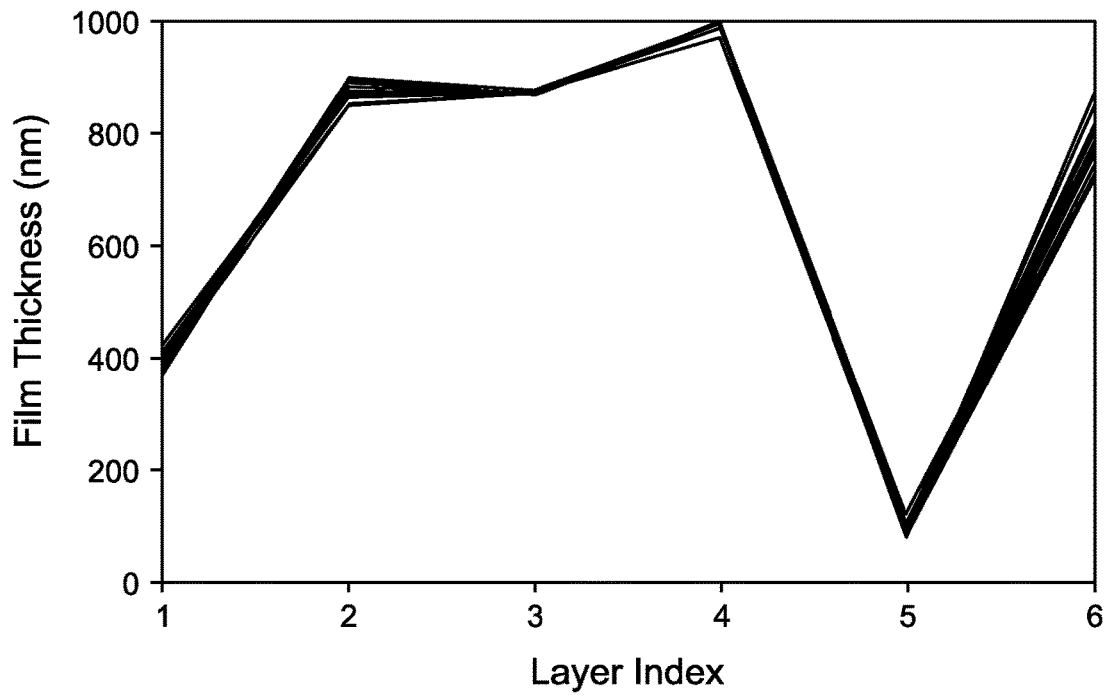
FIG. 5D is a graphical illustration of ICE layer thickness variation in each layer for the ICE designs shown in exemplary embodiment of FIG. 5C.
Figure 5E:
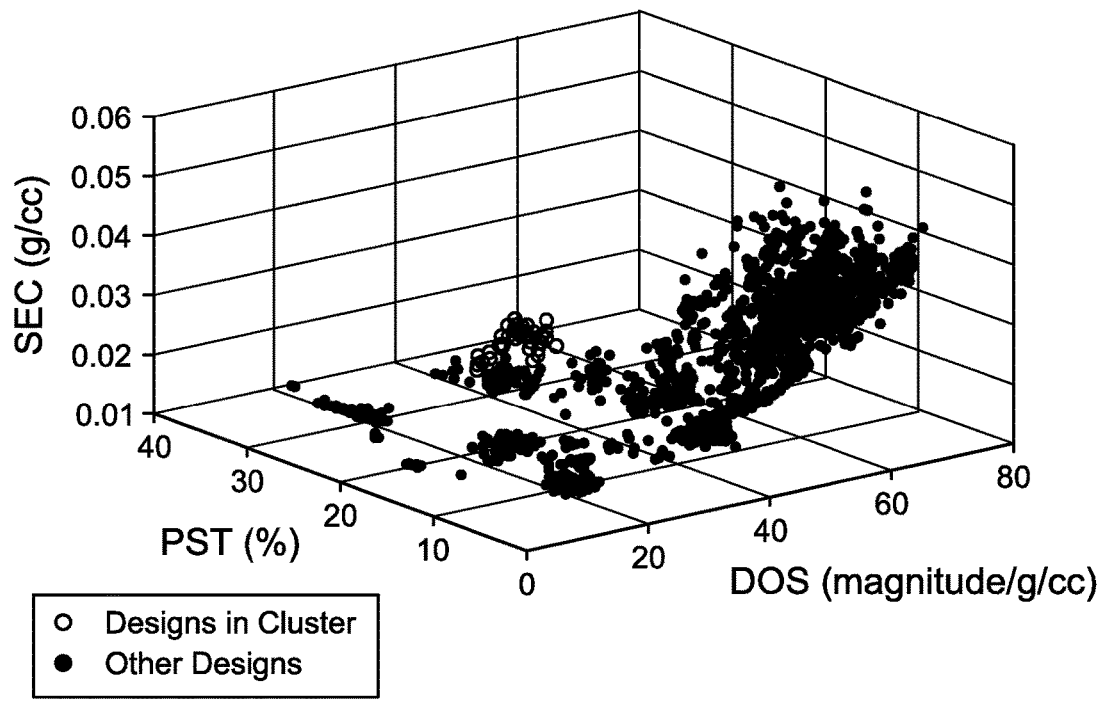
FIG. 5E is a graphical illustration of ICE structure performance variation among similar designs and other designs.

FIG. 5D illustrates the variation of the film thickness for each layer among the 100 designs given in FIG. 5C, while FIG. 5E illustrates the performance variation (labeled in black circles) of these designs. It can be observed from FIG. 5D that the largest variation (more than 100 nm, for example) in film thickness occurs on layer 6, followed by layer 2 (about 50 nm, for example), and layer 1, 4, 5, 3, respectively. These variations may reflect a similar order of magnitude in manufacturing tolerance during ICE fabrication. A large change of objective components in FIG. 5E in response to the small thickness variation in FIG. 5D may indicate an infeasible ICE design due to the potential risk in performance degradation induced by manufacturing. By reviewing the ICE transmittance spectra in each cluster, along with corresponding layered film thicknesses and performance measurements, the best ICE manufacturing candidates may be determined. As a result, the present invention may provide significant cost reduction by eliminating or minimizing the need for running the costly fabricability simulations.

Moreover, in yet another exemplary embodiment of the present invention, similar ICE structure designs generated utilizing methodology 300 can also be used as references for on-line optimization (tolerance control) during ICE fabrication. During ICE fabrication, there may exist conditions that, for example, alter the refractive index of the materials. Therefore, in-situ thickness and spectroscopic measurements (for example, wavelength dependent transmission) are conducted during the deposition process to determine the refractive index. Layer thicknesses may be optimized using the most current refractive index information (from what's been deposited) to control the remaining thickness of the current layer and future layer thickness to maintain the desired predictive performance figure of merit. Exemplary predictive performance figure of merits for on-line optimization may be, for example, SEC or SEP. Therefore, using a database of designs output from methodology 300 as references, the ICE fabrication process can be modified to output designs, or slightly modified designs reflecting only a small % change in layer thickness, which correspond to the optimized designs already included in the database.

Accordingly, the present invention provides a platform by which to efficiently design ICE structures for use in a variety of applications such as, for example, optical fluid identification tools for downhole and surface applications. The exemplary embodiments described herein provide a number of advantages. First, the present invention drastically reduces the computational requirement when compared to conventional approaches. For example, the present invention may only output 4000-8000 ICE designs to find the optimal solution, in stark contrast to the roughly 100,000 plus designs produced using conventional ICE design methods. Second, the present invention provides a simplified computational algorithm, thus reducing the associated computing requirement. As described herein, exemplary embodiments of the present invention utilize an efficient genetic algorithm, instead of the complex and computing-resource taxing gradient-based multivariate search method of existing approaches.

Third, the present invention provides a drastic reduction in computing power and computational cost. For example, the present invention may be easily carried out on a single PC or notebook computer over the course of 3-4 hours. In contrast, conventional methods require a 15-node computer cluster to simulate the 100,000 designs and remove redundant designs over the course of 10-12 hours. Accordingly, the present invention only requires $\frac{1}{10}$ of the computational resources of existing approaches and, hence, $\frac{1}{10}$ of the cost.

The foregoing methods and systems described herein are particularly useful in designing ICE structures for use in wellbores. As described, the system utilizes a genetic algorithm to optimize the design of ICE structures to detect desired analytes or sample characteristics. In one exemplary application, once the design of the ICE structures has been optimized, it is then fabricated and positioned downhole or as part of a downhole assembly to perform monitoring or sensing operations.

An exemplary methodology of the present invention provides a method to design an integrated computation element ("ICE") structure, the method comprising defining at least one characteristic of a proposed ICE structure comprising a plurality of ICE layers, selecting an ICE structure as defined by the at least one characteristic, utilizing a genetic algorithm to optimize a thickness of the plurality of ICE layers, thereby calculating one or more optimized designs and outputting the one or more optimized designs. In another methodology, utilizing the genetic algorithm further comprises utilizing a multi-objective merit function. In yet another, utilizing the multi-objective merit function further comprises aggregating at least two of a standard error of calibration, detector output sensitivity, and percentage of ICE transmittance. In another, utilizing the genetic algorithm further comprises ranking the one or more optimized designs based upon a merit-function performance.

In yet another exemplary methodology, utilizing the genetic algorithm further comprises continuing to utilize the genetic algorithm to optimize the thickness of the plurality of ICE layers until a maximum number of ICE generations have been simulated or a performance criteria has been met. In yet another, outputting the one or more optimized designs further comprises outputting optimized designs corresponding to ICE structures having a range of ICE layers. Another methodology further comprises ranking the ICE structures having the range of ICE layers based upon a merit-function performance. Yet another further comprises fabricating an ICE structure based upon the one or more optimized designs. Another exemplary methodology further comprises utilizing the one or more optimized designs to perform on-line optimization during the fabrication of the ICE structure. In another, defining at least one characteristic of a proposed ICE structure further comprises analyzing at least one characteristic that comprises a range of ICE layers.

Yet another exemplary methodology of the present invention provides a method to design an integrated computation element ("ICE") structure, the method comprising utilizing a genetic algorithm to optimize the design of the ICE structure. In another methodology, utilizing a genetic algorithm to optimize the design of the ICE structure further comprises utilizing the genetic algorithm to optimize a thickness of ICE layers. In yet another exemplary embodiment, utilizing a genetic algorithm to optimize the design of the ICE structure further comprises utilizing a multi-objective merit function to optimize a thickness of ICE layers.

Furthermore, the exemplary methodologies described herein may be implemented by a system comprising processing circuitry or a computer program product comprising instructions which, when executed by at least one processor, causes the processor to perform any of the methodology described herein.

Although various embodiments and methodologies have been shown and described, the invention is not limited to such embodiments and methodologies and will be understood to include all modifications and variations as would be apparent to one skilled in the art. Therefore, it should be understood that the invention is not intended to be limited to the particular forms disclosed. Rather, the intention is to cover all modifications, equivalents and alternatives falling within the spirit and scope of the invention as defined by the appended claims.

What is claimed is:

1. A method to design an integrated computation element ("ICE") structure, the method comprising:
   defining at least one characteristic of a proposed ICE structure comprising a plurality of ICE layers;
   selecting an ICE structure as defined by the at least one characteristic;
   utilizing a genetic algorithm to optimize a thickness of the plurality of ICE layers, thereby calculating one or more optimized designs; and
   outputting the one or more optimized designs.

2. A method as defined in claim 1, wherein utilizing the genetic algorithm further comprises utilizing a multi-objective merit function.

3. A method as defined in claim 2, wherein utilizing the multi-objective merit function further comprises aggregating at least two of a standard error of calibration, detector output sensitivity, and percentage of ICE transmittance.

4. A method as defined in claim 1, wherein utilizing the genetic algorithm further comprises ranking the one or more optimized designs based upon a merit-function performance.

5. A method as defined in claim 1, wherein utilizing the genetic algorithm further comprises continuing to utilize the genetic algorithm to optimize the thickness of the plurality of ICE layers until a maximum number of ICE generations have been simulated or a performance criteria has been met.

6. A method as defined in claim 1, wherein outputting the one or more optimized designs further comprises outputting optimized designs corresponding to ICE structures having a range of ICE layers.

7. A method as defined in claim 6, further comprising ranking the ICE structures having the range of ICE layers based upon a merit-function performance.

8. A method as defined in claim 1, further comprising fabricating an ICE structure based upon the one or more optimized designs.

9. A method as defined in claim 8, further comprising utilizing the one or more optimized designs to perform on-line optimization during the fabrication of the ICE structure.

10. A method as defined in claim 1, wherein defining at least one characteristic of a proposed ICE structure further comprises analyzing at least one characteristic that comprises a range of ICE layers.

11. A system comprising processing circuitry to implement a method comprising:
    defining at least one characteristic of a proposed ICE structure comprising a plurality of ICE layers;
    selecting an ICE structure as defined by the at least one characteristic;
    utilizing a genetic algorithm to optimize a thickness of the plurality of ICE layers, thereby calculating one or more optimized designs; and
    outputting the one or more optimized designs.

12. The system of claim 11, wherein utilizing the genetic algorithm further comprises utilizing a multi-objective merit function.

13. The system of claim 11, wherein utilizing the genetic algorithm further comprises ranking the one or more optimized designs based upon a merit-function performance.

14. The system of claim 11, wherein utilizing the genetic algorithm further comprises continuing to utilize the genetic algorithm to optimize the thickness of the plurality of ICE layers until a maximum number of ICE generations have been simulated or a performance criteria has been met.

15. The system of claim 11, wherein outputting the one or more optimized designs further comprises outputting optimized designs corresponding to ICE structures having a range of ICE layers.

16. The system of claim 15, further comprising ranking the ICE structures having the range of ICE layers based upon a merit-function performance.

17. The system of claim 11, further comprising fabricating an ICE structure based upon the one or more optimized designs.

18. The system of claim 17, further comprising utilizing the one or more optimized designs to perform on-line optimization during the fabrication of the ICE structure.

19. The system of claim 11, wherein defining at least one characteristic of a proposed ICE structure further comprises analyzing at least one characteristic that comprises a range of ICE layers.

20. A computer program product comprising instructions stored on a non-transitory computer readable storage medium which, when executed by at least one processor, causes the processor to perform a method comprising:
    defining at least one characteristic of a proposed ICE structure comprising a plurality of ICE layers;
    selecting an ICE structure as defined by the at least one characteristic;
    utilizing a genetic algorithm to optimize a thickness of the plurality of ICE layers, thereby calculating one or more optimized designs; and
    outputting the one or more optimized designs.

21. The system of claim 20, wherein utilizing the multi-objective merit function further comprises aggregating at least two of a standard error of calibration, detector output sensitivity, and percentage of ICE transmittance.

22. The computer program product of claim 20, wherein utilizing the genetic algorithm further comprises utilizing a multi-objective merit function.

23. The computer program product of claim 22, wherein utilizing the multi-objective merit function further comprises aggregating at least two of a standard error of calibration, detector output sensitivity, and percentage of ICE transmittance.

24. The computer program product of claim 20, wherein utilizing the genetic algorithm further comprises ranking the one or more optimized designs based upon a merit-function performance.

25. The computer program product of claim 20, wherein utilizing the genetic algorithm further comprises continuing to utilize the genetic algorithm to optimize the thickness of the plurality of ICE layers until a maximum number of ICE generations have been simulated or a performance criteria has been met.

26. The computer program product of claim 20, wherein outputting the one or more optimized designs further comprises outputting optimized designs corresponding to ICE structures having a range of ICE layers.

27. The computer program product of claim 26, further comprising ranking the ICE structures having the range of ICE layers based upon a merit-function performance.

28. The computer program product of claim 20, further comprising fabricating an ICE structure based upon the one or more optimized designs.

29. The computer program product of claim 28, further comprising utilizing the one or more optimized designs to perform on-line optimization during the fabrication of the ICE structure.

30. The computer program product of claim 20, wherein defining at least one characteristic of a proposed ICE structure further comprises analyzing at least one characteristic that comprises a range of ICE layers.

\* \* \* \* \*